United States Patent
Chu et al.

(10) Patent No.: US 7,999,251 B2
(45) Date of Patent: Aug. 16, 2011

(54) NANOWIRE MOSFET WITH DOPED EPITAXIAL CONTACTS FOR SOURCE AND DRAIN

(75) Inventors: Jack O. Chu, Manhasset Hills, NY (US); Guy M. Cohen, Mohegan Lake, NY (US); John A. Ott, Greenwood Lake, NY (US); Michael J. Rooks, Briarcliff Manor, NY (US); Paul M. Solomon, Yorktown Heights, NY (US)

(73) Assignee: International Business Machines Corporation, Armonk, NY (US)

(*) Notice: Subject to any disclaimer, the term of this patent is extended or adjusted under 35 U.S.C. 154(b) by 645 days.

(21) Appl. No.: 11/519,176

(22) Filed: Sep. 11, 2006

(65) Prior Publication Data

US 2008/0061284 A1    Mar. 13, 2008

(51) Int. Cl.
*H01L 29/775* (2006.01)
*H01L 29/786* (2006.01)

(52) U.S. Cl. .................. 257/29; 257/347; 257/E29.245; 257/E29.286

(58) Field of Classification Search .............. 257/26–27, 257/29, 347–354, 365–366, E29.245, E29.286–E29.287, 257/E29.299; 438/283–284, 300–302
See application file for complete search history.

(56) References Cited

U.S. PATENT DOCUMENTS

| | | | |
|---|---|---|---|
| 6,531,742 B2* | 3/2003 | Kim | 257/352 |
| 6,858,478 B2* | 2/2005 | Chau et al. | 438/149 |
| 7,193,279 B2* | 3/2007 | Doyle et al. | 257/401 |
| 7,358,121 B2 | 4/2008 | Chau et al. | |
| 7,473,943 B2* | 1/2009 | Mostarshed et al. | 257/213 |
| 7,518,196 B2* | 4/2009 | Chau et al. | 257/401 |
| 2002/0093053 A1* | 7/2002 | Chan et al. | 257/347 |
| 2004/0145019 A1* | 7/2004 | Dakshina-Murthy et al. | 257/349 |
| 2005/0142766 A1* | 6/2005 | Hareland et al. | 438/268 |
| 2005/0156248 A1* | 7/2005 | Chen et al. | 257/353 |
| 2005/0242395 A1* | 11/2005 | Chen et al. | 257/347 |
| 2006/0049429 A1* | 3/2006 | Kim et al. | 257/213 |
| 2006/0172468 A1* | 8/2006 | Orlowski | 438/149 |
| 2006/0220015 A1* | 10/2006 | Rho | 257/59 |
| 2006/0231957 A1* | 10/2006 | Kim et al. | 257/759 |
| 2006/0234519 A1* | 10/2006 | Pan et al. | 438/795 |
| 2006/0270164 A1* | 11/2006 | Li et al. | 438/283 |
| 2007/0045725 A1* | 3/2007 | Yun et al. | 257/330 |
| 2007/0232007 A1* | 10/2007 | Forbes | 438/301 |

(Continued)

FOREIGN PATENT DOCUMENTS

| CN | 1518771 A | 8/2004 |
|---|---|---|
| CN | 1770467 A | 5/2006 |

OTHER PUBLICATIONS

Colinge, J.P., et al. "Silicon-On-Insulator 'Gate-All-Around Device'." International Electron Devices Meeting, 1990. Technical Digest. (Dec. 9-12, 1990): pp. 595-598.*

(Continued)

*Primary Examiner* — Matthew W Such

(74) *Attorney, Agent, or Firm* — Scully, Scott, Murphy & Presser, P.C.; Vazken Alexanian

(57) ABSTRACT

A FET structure with a nanowire forming the FET channel, and doped source and drain regions formed by radial epitaxy from the nanowire body is disclosed. A top gated and a bottom gated nanowire FET structures are discussed. The source and drain fabrication can use either selective or non-selective epitaxy.

15 Claims, 12 Drawing Sheets

U.S. PATENT DOCUMENTS

2007/0246784 A1  10/2007  Kang et al.
2008/0191196 A1* 8/2008  Lu et al. .......................... 257/27

OTHER PUBLICATIONS

Ruzyllo, J. Semiconductor Glossary: An Introduction to Semiconductor Technology. Prosto Multimedia Publishing: State College, PA (2004): pp. 100.*

Zhang, R.Q., et al. "Structures and Energetics of Hydrogen-Terminated Silicon Nanowire Surfaces." J. Chem. Phys., vol. 123 (2005): Article 144703.*

Lu, X., et al. "Modification of the Lattice Thermal Conductivity in Semiconductor Rectangular Nanowires." J. Appl. Phys., vol. 93 (2003): pp. 1219-1229.*

Kalache et al. Observation of Incubation Times in the Nucleation of Silicon Nanowires Obtained by the Vapor-Liquid-Solid Method, The Japan Society of Applied Physics, 2006, pp. L190-L193, vol. 45, No. 7.

Tutuc et al. Realization of a Linear Germanium Nanowire p-n Junction, xxxx American Chemical Society, 2006, vol. 0, No. 0.

* cited by examiner

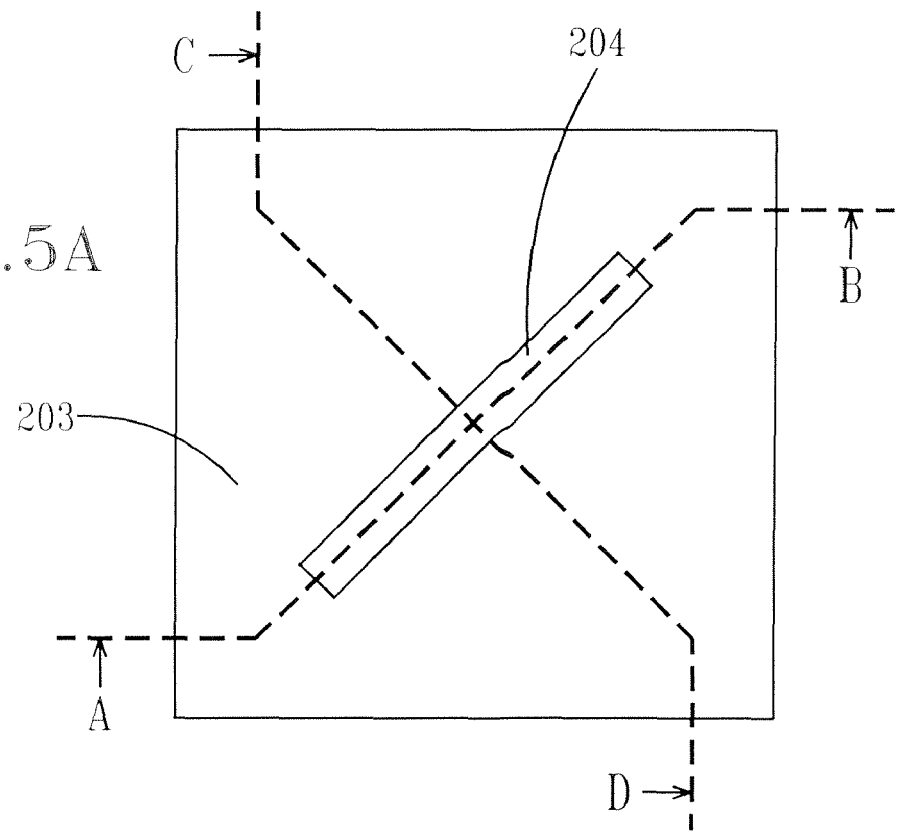
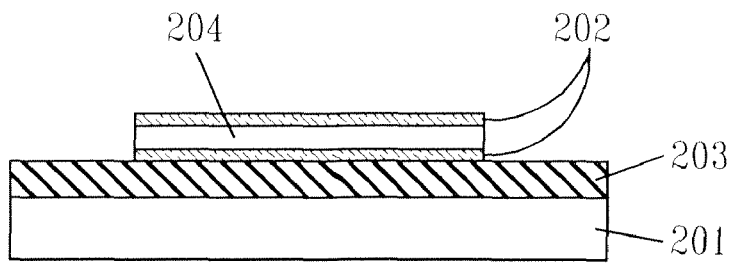
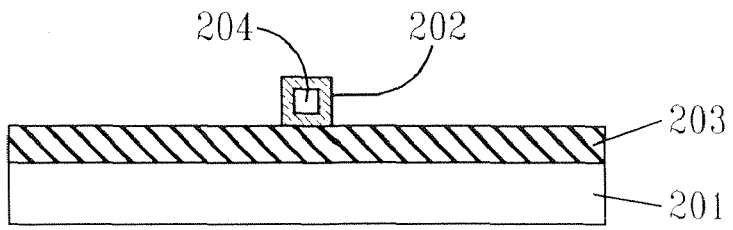

NANOWIRE MOSFET WITH DOPED EPITAXIAL CONTACTS FOR SOURCE AND DRAIN

FIELD OF THE INVENTION

The present invention relates to electronic devices based on semiconductor nanowires, and more specifically to a field effect transistor (FET) with a nanowire channel and doped semiconductor source and drain regions. The present invention also relates to methods of fabricating doped semiconductor source/drain regions which are in contact with the nanowire channel.

BACKGROUND OF THE INVENTION

Forming a doped source and a drain to a semiconductor nanowire presents several challenges. First, it is difficult to in-situ dope nanowires during their growth since dopants are incorporated into the nanowire body from the gas-phase or by radial growth (E. Tutuc et al., Nano Lett, September 2006, in press). For example, a lightly doped portion of a nanowire will be counter-doped if a following segment is grown to be heavily doped. Second, due to growth incubation time the onset for a doped region in in-situ doped nanowires will exhibit variations corresponding to the delay in nucleation each nanowire experienced (B. Kalache et al., JJAP, 45, p. L190, 2006). Third, heavy in-situ doping was shown to lead to nanowire tapering (in Ge nanowires) and loss of gold from the catalyst (in Si nanowires doped with diborane). Fourth, even if segmented doping along a nanowire body can be achieved, there are no simple methods to align the contacts and the gate to each segment. Fifth, dopant variations will make it hard to control doping in thin nanowires. For example, a nanowire segment with a diameter of 10 nm, a length of 0.25 micron and with a doping level of $1E19$ $cm^{-3}$ contains about 200 atoms of the dopant. If the nanowire diameter is reduced to 5 nm, the 0.25 micron segment will contain only about 50 dopant atoms.

To build a metal oxide semiconductor field effect transistor (MOSFET), the nanowire should have an n-p-n (n-FET) or a p-n-p (p-FET) doping profile along the nanowire main axis. Several approaches were proposed to achieve that profile. The first is by in-situ doping of the nanowire during growth (Y. Wang et al., Device Research Conference digest, p. 175, 2006). The disadvantages and limitation of the in-situ technique were discussed earlier. The second approach is based on ion implantation (W. Riess et al., Inter. Conf. on Nanoscience and Technology, Luzern, August 2006). This approach has the disadvantage that it can only be used with fat nanowires (diameters larger than 30 nm) since nanowires with small diameters will be amorphized and sputtered by the implant. Recrystallization of the doped regions may not be possible due to the one-dimensional nature of the nanowire (spontaneous recrystallization will dominate during solid phase epitaxy). As a result, most of the nanowire FETs that were reported to date were fabricated with Schottky (metal) source and drain.

In view of the foregoing, there is a need for providing a nanowire FET with doped semiconductor source and drain regions. To reduce device variability, there is also a need for fabrication methods that do not relay on pre-doped nanowires, but rather use undoped nanowires.

SUMMARY OF THE INVENTION

The present invention provides a nanowire FET (field effect transistor) with doped source and drain regions. In accordance with the present invention, an undoped nanowire forms the channel region of the inventive FET. Radial epitaxy is used to form the FET source and drain in selected regions of the nanowire.

In a first aspect of the present invention, a semiconductor structure such as a FET comprising a single-crystal nanowire channel, a gate for controlling the current through the nanowire channel, and doped thickened regions extending from the nanowire channel (or so-called nanowire body) in a radial direction that form the source and drain regions of the device, is described.

Specifically, the semiconductor structure of the present invention includes an undoped nanowire channel, a gate dielectric, a gate conductor formed under, above or all around the nanowire channel to control the current in the nanowire channel, and doped semiconductor regions formed adjacent to the gate that were added onto the nanowire channel by radial crystal growth to form a source region and a drain region.

In some embodiments of the present invention, the gate conductor consists of a conductive substrate on which the nanowire resides. In this configuration, the nanowire channel is back-gated. In another embodiment of the present invention, the gate conductor is deposited over the nanowire. In this case, the nanowire is top gated. In yet another embodiment of the present invention, the gate conductor is deposited all-around the nanowire channel. This configuration is referred to as an all-around gate.

In one embodiment, the source and drain regions made to the nanowire channel include at least one chemical element different from that included in the nanowire channel. For example, a silicon (Si) nanowire may have source and drain regions that are made of a SiGe alloy and are doped with boron (B) or phosphorus (P).

In a second aspect of the present invention, methods for fabricating a FET with a nanowire channel and doped semiconductor source and drain regions are described. In one of these methods, a semiconductor nanowire is provided over a conductive substrate on which a gate dielectric is formed. A dielectric stack is blanket deposited over the substrate. Contact holes, which expose portions of the nanowire and set the gate length of the FET, are made in the dielectric stack to define the source and drain regions. Radial in-situ doped semiconductor crystal growth fills the contact holes and forms the source and drain regions. Chemical mechanical polishing (CMP) is used to remove the excess semiconductor film deposited over the dielectric stack. Contacts are made to the source and drain regions to complete the device fabrication.

In another method of the present invention, a semiconductor nanowire coated with a gate dielectric is provided over an insulating layer formed over a host substrate. A gate conductor strip is deposited over the nanowire. Sidewalls dielectric spacers are formed on either side of the gate conductor strip. Gate dielectric regions not covered by the gate conductor or the sidewall spacers are removed, and radial in-situ doped growth of a semiconductor is used to form the source and drain regions.

The methods of the present invention are described using silicon nanowires and silicon processing. The methods can also be practiced with other semiconductors such as Ge or III-V semiconductors.

BRIEF DESCRIPTION OF THE DRAWINGS

FIGS. 5A-B, 6A-B, 7A-B, 8A-B, and 9A-B are pictorial representations (through top views and cross sectional views) illustrating the basic processing steps for fabricating a nanowire FET with doped semiconductor source and drain regions, and top gating.

DETAILED DESCRIPTION OF THE INVENTION

Figure 1A:
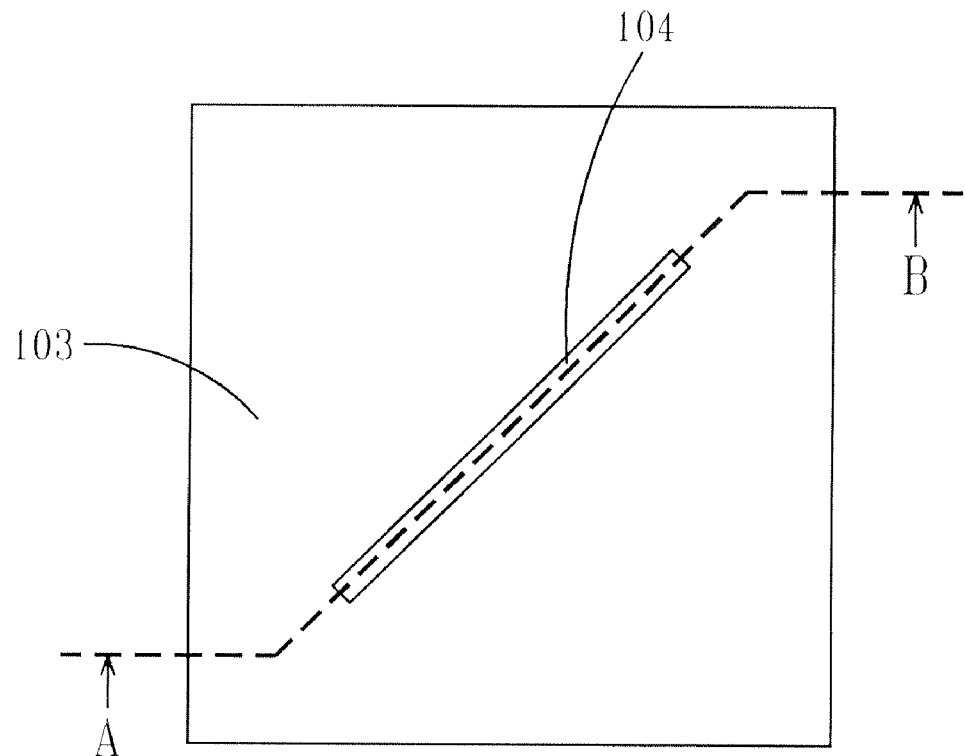
FIGS. 1A-B, 2A-B, 3A-B, and 4A-B are pictorial representations (through top views and cross sectional views) illustrating the basic processing steps for fabricating a nanowire FET with doped semiconductor source and drain regions, and bottom gating.
Figure 1B:
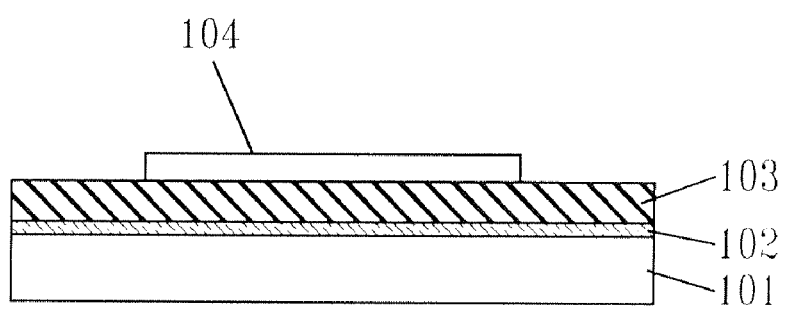

The present invention, which provides a nanowire FET with doped semiconductor source and drain regions as well as methods for fabricating the same, will now be described in greater detail by referring to the following discussion. In this discussion, reference will be made to various drawings that illustrate embodiments of the present invention. Since the drawings of the embodiments of the present invention are provided for illustrative purposes, the structures contained therein are not drawn to scale.

In the following description, numerous specific details are set forth, such as particular structures, components, materials, dimensions, processing steps and techniques, in order to provide a thorough understanding of the present invention. However, it will be appreciated by one of ordinary skill in the art that the invention may be practiced with viable alternative process options without these specific details. In other instances, well-known structures or processing steps have not been described in detail in order to avoid obscuring the invention.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

It is again emphasized that the methods of the present invention are described using silicon nanowires and silicon processing. Although such a description is provided herein below, the inventive methods can also be practiced with other semiconductor materials such as, for example, Ge or III-V semiconductors. When non-Si-containing semiconductors are used, the processing steps of the present invention are basically the same except that growth temperature and dopant species applied are adapted to the specific semiconductor used. Use of Si-containing semiconductor materials such as Si, SiGe, Si/SiGe, SiC or SiGeC, for example, is however preferred. It is noted that a portion of the nanowires is used in the present invention as the device channel or body.

The basic method is shown in FIGS. 1-4. Referring to FIGS. 1A (top-down view) and 1B (cross sectional view through line A-B shown in FIG. 1A), a doped silicon substrate 101 (either n-type or p-type) is used as the starting semiconductor substrate. An insulator film 102 such as silicon dioxide ($SiO_2$), silicon oxynitride (SiON) and multilayers thereof is deposited on the substrate 101. Insulator film 102 serves as a gate dielectric when a back-gate is used to control the channel. A second insulator film 103 such as silicon nitride ($Si_3N_4$) is deposited over film 102. Film 103 is used as an etch stop for hydrofluoric acid (HF) as will be explained later. Other gate dielectric stacks can be used that also are HF resistant. For example, layers 102 and 103 can be replaced with a hafnium oxide ($HfO_2$) film that was annealed at 800° C. (the etch rate of as deposited $HfO_2$ in 100:1 DHF is about 0.7 nm/min, and becomes negligible following the 800° C. anneal).

Nanowires 104 are provided over film 103. By nanowires 104, it is meant highly anisotropic semiconductor crystals. The anisotropy is reflected in their external structure (i.e., morphology). The nanowires 104 are filamentary crystals with a very high aspect ratio (greater than 10) of length, L, to diameter, d. For example, silicon nanowires with lengths of L=0.1 microns to 30 microns, and diameters d=100 nm to 3 nm are typical.

Semiconductor nanowires 104 are synthesized by catalytic growth, which is typically carried out in a chemical vapor deposition (CVD) or plasma enhanced chemical vapor deposition (PECVD) chamber. The growth temperature depends on the semiconductor and the precursor used. For example, silicon nanowires are typically grown at a growth temperature from about 370° C. to about 500° C. when silane ($SiH_4$) is used. For silicon tetrachloride ($SiCl_4$), the growth temperature is from about 800° C. to about 950° C. By adding chlorine to $SiH_4$, the growth temperature can be raised to above 600° C. The growth rate of the nanowires 104 depends on the growth temperature and the gas pressure in the growth chamber. Using the example of silicon nanowires, a typical CVD growth rate for $SiH_4$ diluted with $H_2$ (1:1) at a pressure of 1 torr and a growth temperature of 450° C. is about 7.6 μm/hour.

The anisotropic growth of the nanowires 104 is believed to be best described by the vapor-liquid-solid (VLS) mechanism, which is reviewed, for example, in E. I. Givargizov, Highly Anisotropic Crystals, Kluwer academic publishers, Norwell Mass., 1986. Taking silicon nanowires as an example, when the growth is initiated, a catalyst-silicon liquid alloy is formed. With additional supply of Si from the gas phase (e.g., $SiH_4$), the liquid droplet becomes supersaturated with Si and the excess silicon is deposited at the solid-liquid interface. As a result, the liquid droplet rises from the original substrate surface to the tip of a growing nanowire crystal. If the growth temperature is kept below the decomposition temperature of the Si precursor (about 500° C. if $SiH_4$ is used), no deposition of silicon take places on the nanowire sidewalls (i.e., no radial growth). As a result, the only growth taking place is that enabled by the metallic catalyst which leads to anisotropic growth. An example of a metallic catalyst that can be employed in the inventive method to form the nanowires 104 is gold (Au).

Figure 2A:
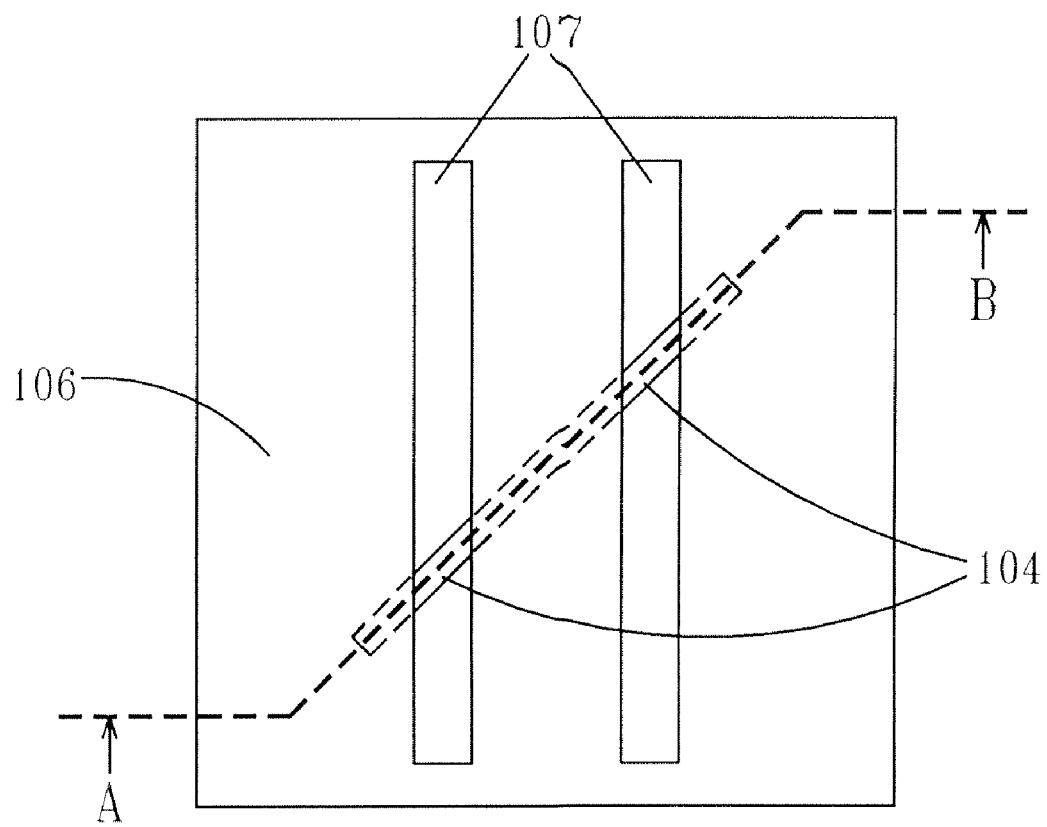
Figure 2B:
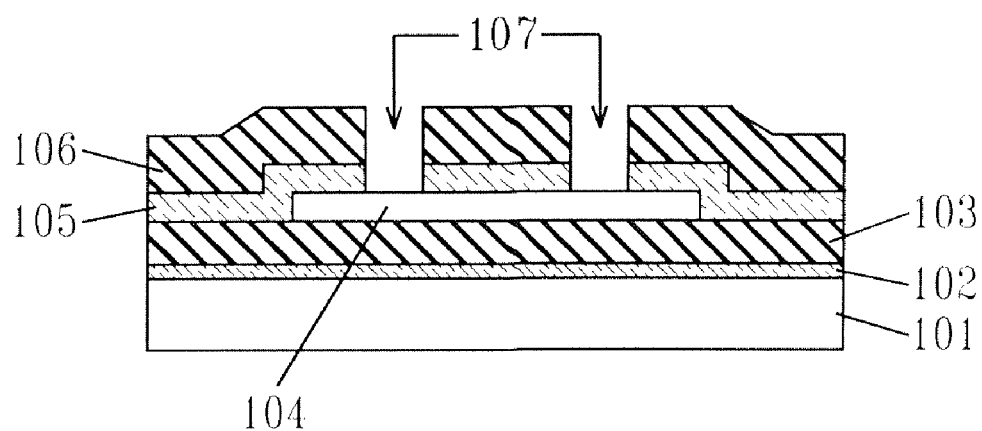

Referring to FIGS. 2A (top-down view) and 2B (cross sectional view through line A-B shown in FIG. 2A), a dielectric stack comprising a $SiO_2$ film 105 and a $Si_3N_4$ film 106 is blanket deposited by known techniques such as CVD over the nanowires 104. The source and drain regions are defined by etching contact holes 107 that expose portions of the nanowire 104. The spacing between the contact holes 107 sets the gate length, for a back-gate controlled FET. The contact hole etch typically consists of two steps. In a first step, the $Si_3N_4$ film 106 is selectively etched with respect to the $SiO_2$ film 105. For example, reactive ion etching (RIE) using a gas mixture of $CH_3F$ (9 sccm), $CO_2$ (50 sccm), $O_2$ (10 sccm), and $CHF_3$ (1 sccm) can be used to etch $Si_3N_4$ with a selectivity higher than 5:1 with respect to $SiO_2$. The second etching step consists of a selective etch of the $SiO_2$ film 105, which exposes the nanowires 104. As an example, the selective removal of the $SiO_2$ film can be carried out by diluted hydrofluoric acid (DHF), or buffered HF. The stripping of film 105 also exposes the back-gate dielectric stack (e.g., film 103). This is why film 103 is chosen to be resistive to the method used to strip film 105. For example, in the case where DHF is used to strip film 105, film 103 can be LPCVD $Si_3N_4$ or annealed $HfO_2$, since both films exhibit a negligible etching in DHF.

Figure 3A:
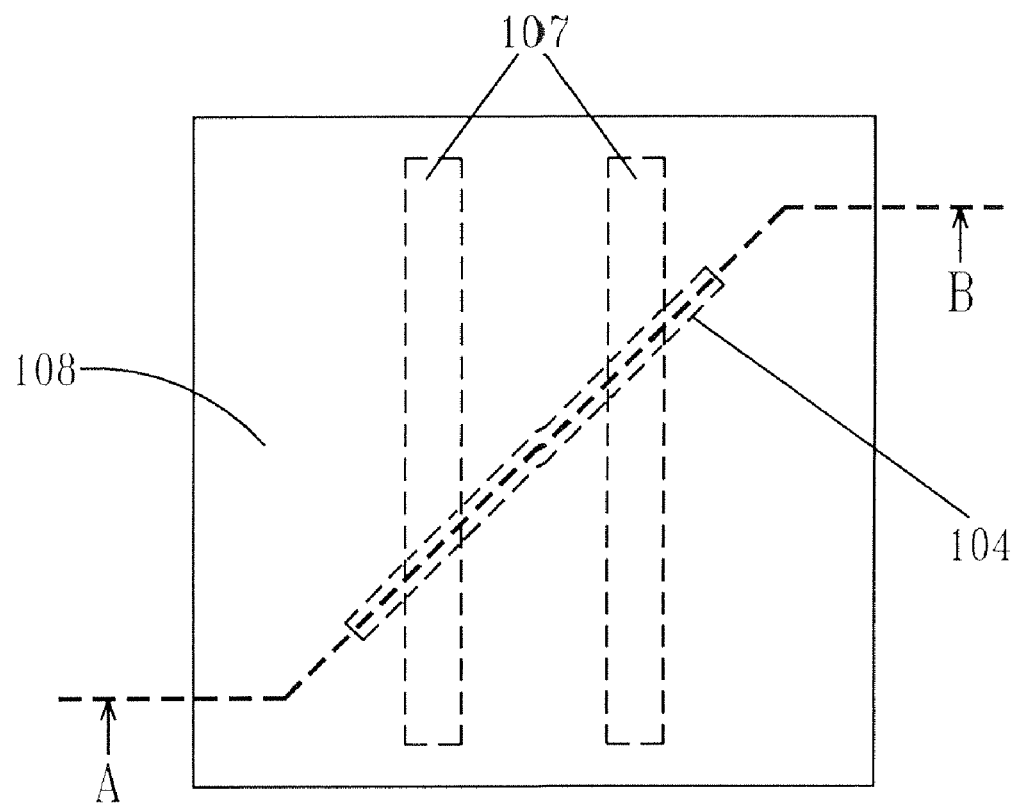
Figure 3B:
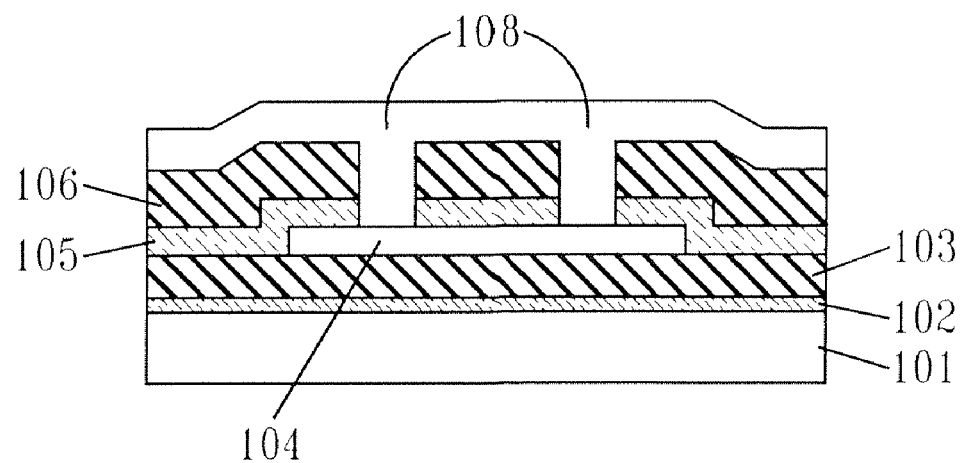

Referring to FIGS. 3A (top-down view) and 3B (cross sectional view through line A-B shown in FIG. 3A), a semiconductor material 108 matching the semiconductor material of nanowire 104 (e.g., Si or SiGe in the case of silicon nanowires) is epitaxially grown or deposited over the structure. Epitaxial growth is expected only over exposed surfaces of the nanowires 104, which serves as a template for the growth. Over other surfaces, the semiconductor material 108 is typically poly-crystalline or amorphous.

The semiconductor material 108 also incorporates the dopants required to form the source and drain regions. For example, and when silicon is used as the semiconductor material, boron (B) or indium (In) are typically used for p-type doping, and phosphorus (P) and arsenic (As) are used for n-type doping. The doping is typically introduced into semiconductor material 108 during growth (e.g., in-situ doping). The deposition of the semiconductor material 108 can be achieved by several growth techniques such as chemical vapor deposition (CVD), molecular beam epitaxy (MBE), and atomic layer deposition (ALD). For CVD based techniques, typical precursors for silicon or silicon-germanium growth are silane ($SiH_4$), germane ($GeH_4$), dichlorosilane ($SiH_2Cl_2$) and silicon-tetrachloride ($SiCl_4$). For in-situ doping, typical precursors used are diborane ($B_2H_6$), phosphine ($PH_3$) and arsine ($AsH_3$).

In the present embodiment, the growth of the semiconductor material 108 is non-selective in the sense that the semiconductor material 108 deposits on all surfaces. With many semiconductors, including silicon, germanium, and indium phosphide, it is also possible to obtain selective growth. When selective growth is practiced, the deposition of the semiconductor material 108 occurs only over the surfaces of the nanowires 104, but not over oxide or nitride surfaces. To obtain selective silicon growth, precursors containing chlorides are typically used. Selective growth of indium phosphide is typically obtained when metal-organic precursors are used for the III-group (e.g., trimethyl-indium TMIn).

Figure 4A:
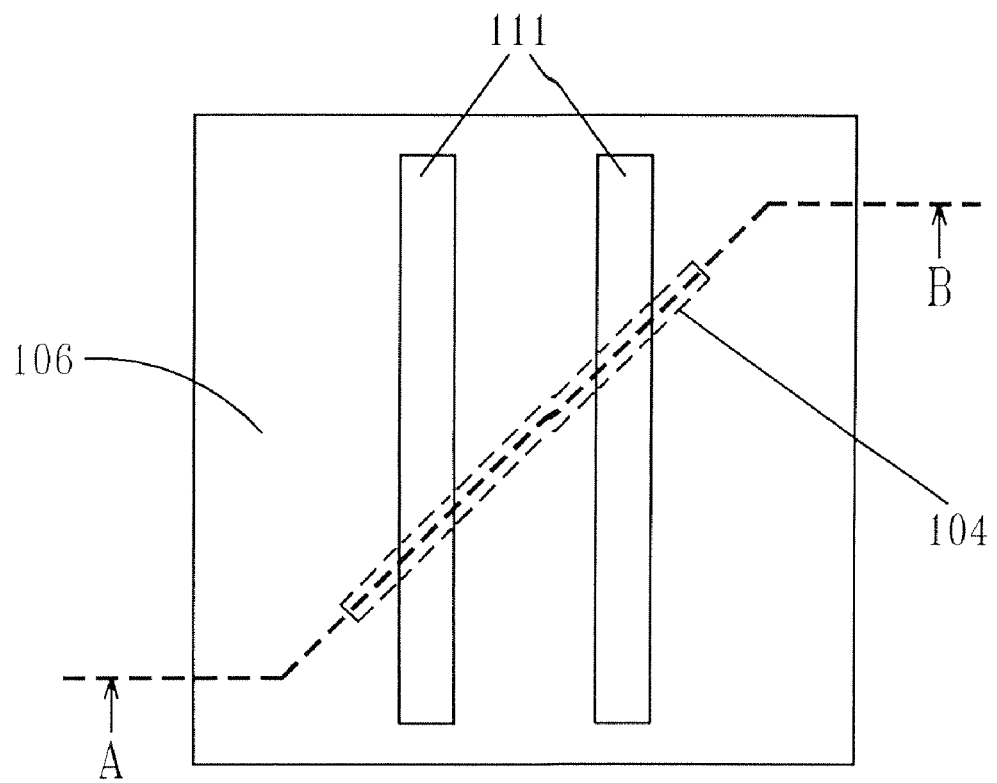
Figure 4B:
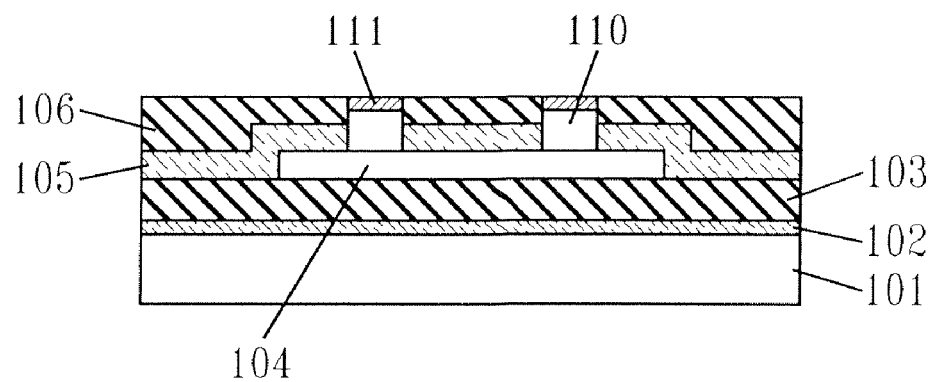

Referring to FIGS. 4A (top-down view) and 4B (cross sectional view through line A-B shown in FIG. 4A), chemical mechanical polishing (CMP) is applied to remove the semiconductor material 108 from over the surface of film 106. Film 106 serves as CMP polish stop layer so that the semiconductor material 108 filling the contact holes 107 is not removed. The removal of the overlay semiconductor material 108 by CMP electrically isolates the filled contacts holes 110 from each other. It also enables the use a self-aligned silicide process (in the case of silicon) for making contacts to the filled contacts holes 110. More specifically, following the CMP step, a metal such as nickel (Ni), cobalt (Co) or titanium (Ti) is blanket deposited over the substrate. The substrate is annealed to allow the metal to react with the silicon in the contacts holes 110. The metal over non-silicon surfaces (e.g., the metal over film 106) remains unreacted. A selective etch is then used to remove the unreacted metal, leaving silicide 111 over the silicon in the contacts holes 110. As an example, in the case that Ni is used, the lower resistivity silicide phase is NiSi. The NiSi phase forms at an annealing temperature of about 420° C., and the etch chemistry used to remove the unreacted metal is $H_2O_2$:$H_2SO_4$ 10:1 at 65° C. for 10 min.

FIGS. 5 to 9 show a method for the fabrication of a nanowire FET with doped semiconductor source and drain regions, and top gating. The structure is similar to the one discussed in FIGS. 1-4 with the following changes: (i) The nanowire is top gated, (ii) the nanowire channel is coated with the gate dielectric, and (iii) selective epitaxy is used to form the source and drain regions of the device.

Referring to FIGS. 5A-5C, a silicon substrate 201 is used as the starting semiconductor substrate. It is noted that FIG. 5A is a top-down view, FIG. 5B is a cross sectional view through line A-B shown in FIG. 5A, and FIG. 5C is a cross sectional view through line C-D shown in FIG. 5A. With top gating of the nanowire channel, the substrate 201 mainly serves for mechanical support and does not need to be conductive as in the case of a back-gated device. An insulator film 203 such as silicon nitride ($Si_3N_4$) is deposited on the substrate 201. In accordance with this embodiment of the present invention, insulator film 203 should be DHF resistant. The thickness of insulator film 203 is not critical since it is not used as a back-gate dielectric as in the back-gated device that was discussed in FIGS. 1-4.

Nanowires 204 are provided over the insulator film 203. The nanowires 204 are synthesized as discussed earlier. Each nanowire 204 is coated with a gate dielectric 202. For example, and in the case of silicon nanowires, typical gate dielectrics that are used include silicon dioxide ($SiO_2$), or silicon oxynitride (SiON), and hafnium oxide ($HfO_2$). Other gate dielectric materials are also possible. The gate dielectrics 202 are thermally grown or deposited over the nanowire's surfaces using conventional silicon processing methods. Coating with the gate dielectric 202 is typically performed prior to introducing the nanowires 204 into a suspension. However, with some gate dielectrics such as thermally grown oxides, it is possible to selectively coat the nanowires 204 with the gate dielectric 202 after it is spin-coated over film 203.

Figure 6A:
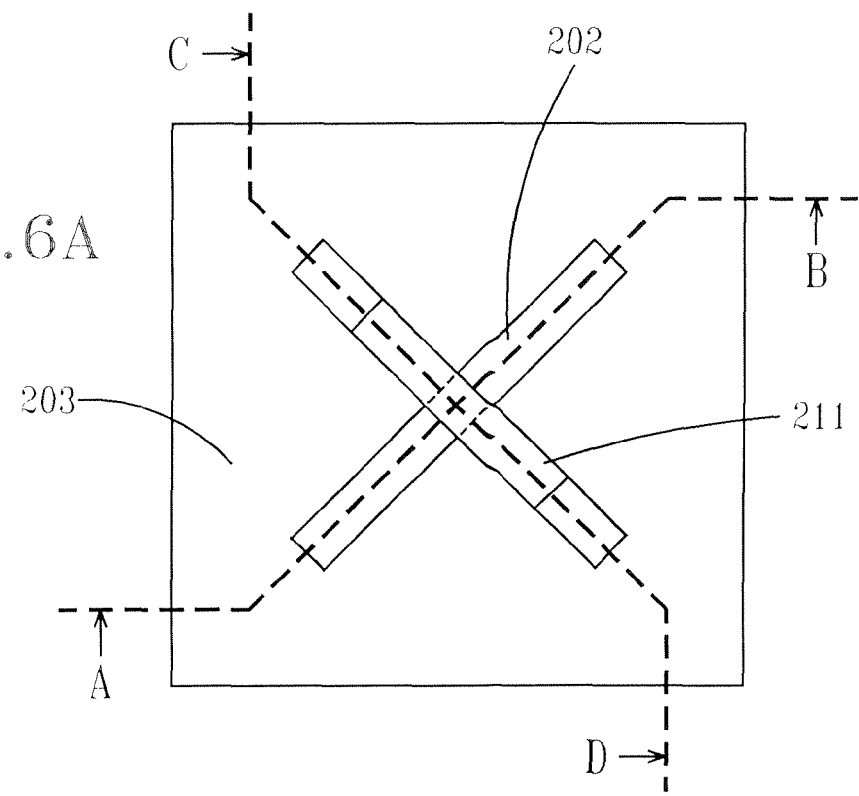
Figure 6B:
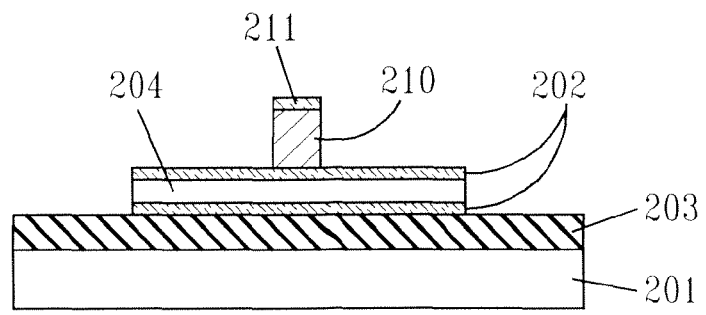
Figure 6C:
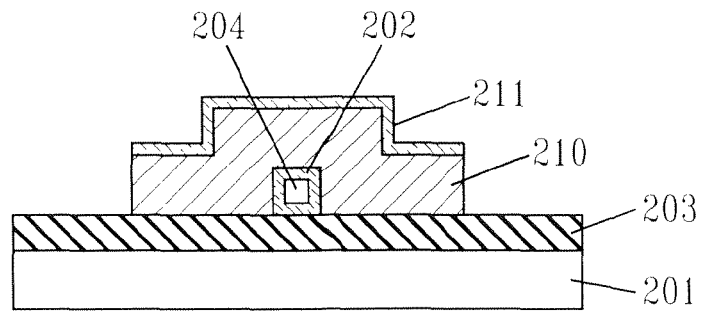

Referring to FIGS. 6A (top-down view), 6B (cross sectional view through line A-B shown in FIG. 6A), and 6C (cross sectional view through line C-D shown in FIG. 6A), the device top gate 210 is formed. A gate conductor is first blanket deposited over the substrate and then the top gate 210 is patterned by lithography and etching. As an example, to fabricate a poly-silicon gate, a poly-silicon film is first blanket deposited over the substrate. A hard mask 211 such as $SiO_2$ is then deposited over the poly-silicon film. Using lithography and RIE, the image of the gate is transferred into mask 211. A selective RIE (e.g., HBr based) is then used to etch the poly-silicon film (except from where it is blocked by mask 211) from over the gate dielectric 202 and the insulator film 203. As can be seen in FIG. 6C, the top gate 210, coats the nanowire channel's 204 top and sidewall surfaces, thus leading to a better channel control.

Figure 7A:
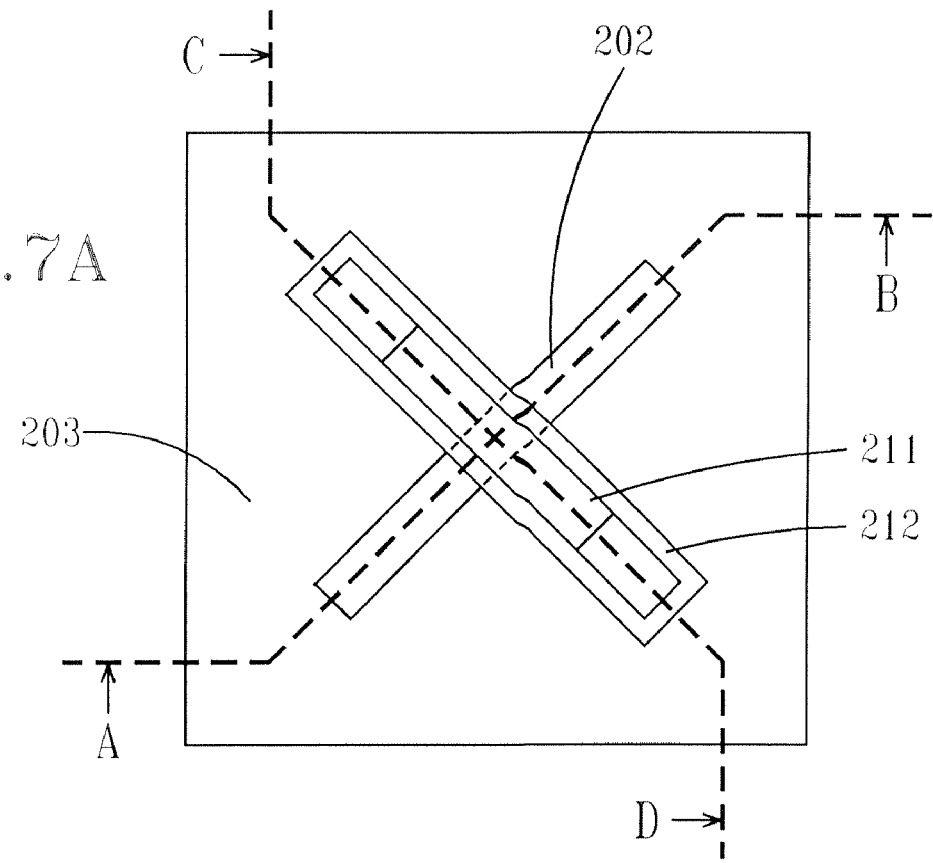
Figure 7B:
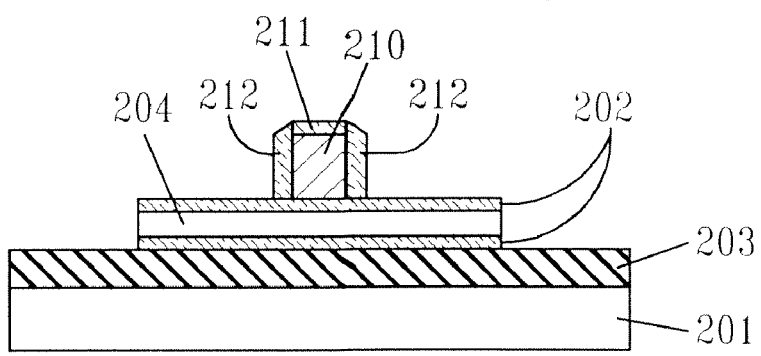
Figure 7C:
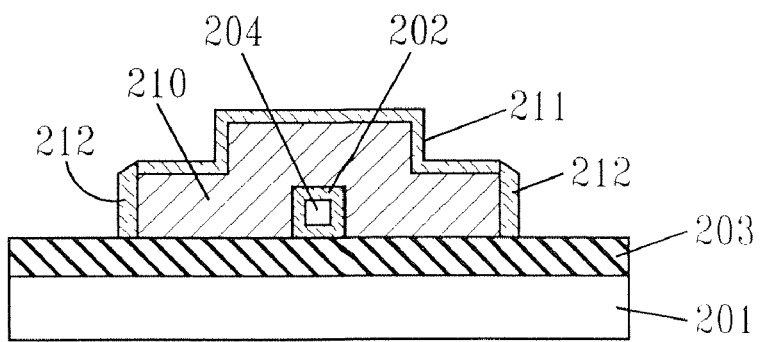

Referring to FIGS. 7A (top-down view), 7B (cross sectional view through line A-B shown in FIG. 7A), and 7C (cross sectional view through line C-D shown in FIG. 7A), spacers 212 are formed over the top gate 210 sidewalls. The spacers 212, which are comprised of an insulating oxide, nitride, oxynitride or multilayers thereof, are used to block epitaxy from taking place on the top gate 210 during the growth of the source and drain regions. The spacers 212 can also be used to offset implants in case the source/drain epitaxy does not include doping. The spacers 212 are formed by deposition and etching.

Figure 8A:
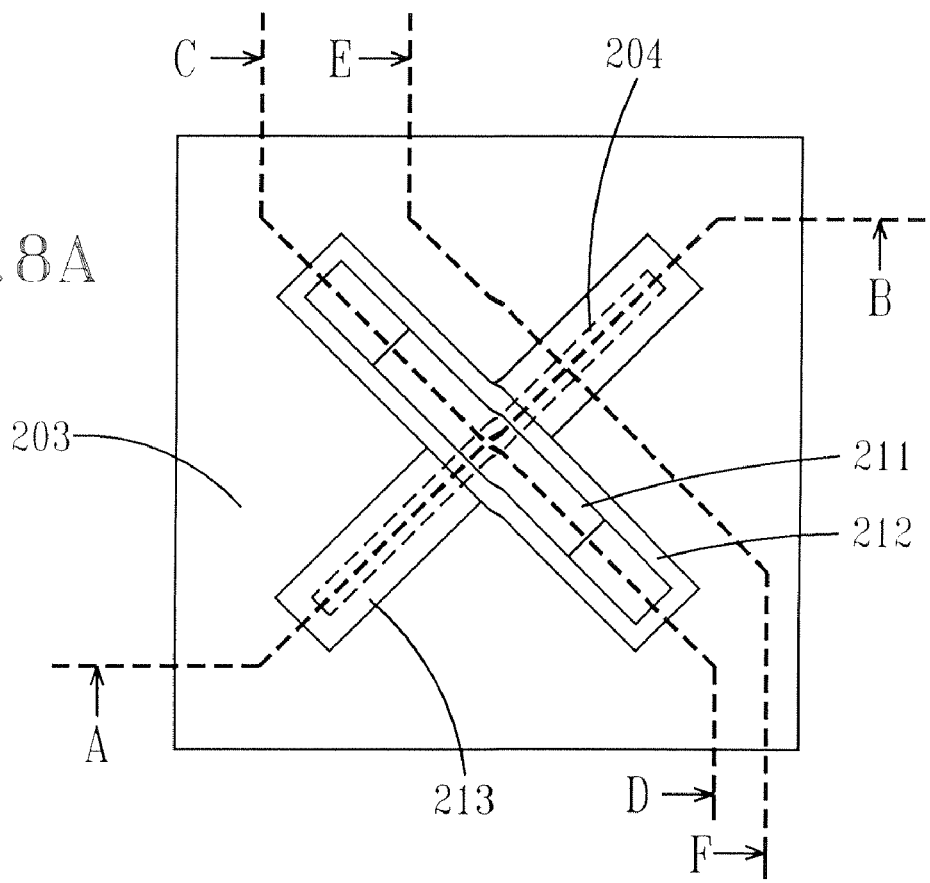
Figure 8B:
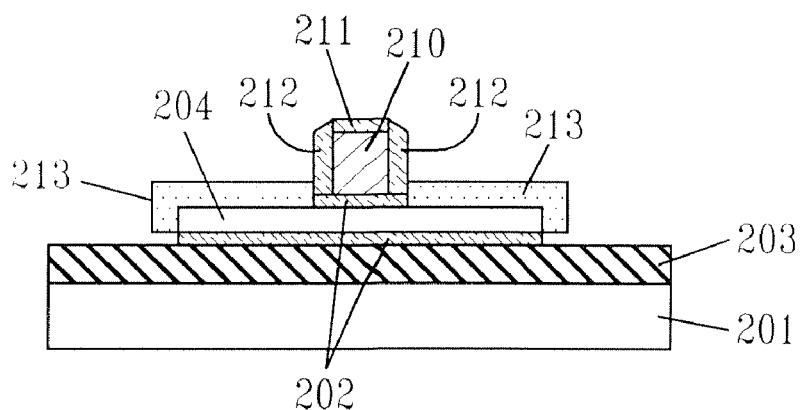
Figure 8C:
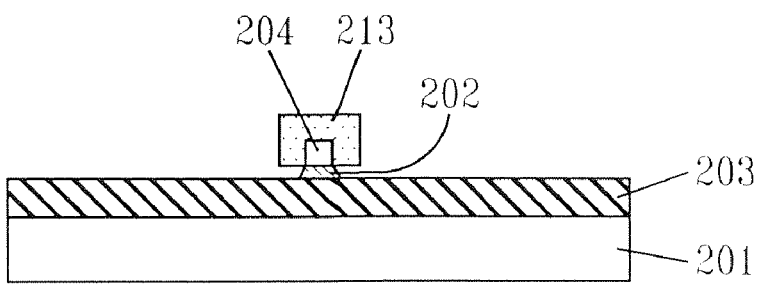

Referring to FIGS. 8A (top-down view), 8B (cross sectional view through line A-B shown in FIG. 8A), and 8C (cross sectional view through line E-F shown in FIG. 8A), the gate dielectric 202 portion that is not covered by the top gate 210 and the spacers 212 is removed selectively with respect to the nanowire body. Selective epitaxy is used to extend the exposed portions of the nanowires 204 forming epitaxial extensions 213 in the radial orientation which forms the source and drain regions of the device. Dopants are introduced into the epitaxial extensions 213 during growth (e.g., in-situ doped epitaxy). The dopants can also be introduced by conventional ion implantation now that the nanowires 204 is thickened by the growth. It is noted that the doped portion of the epitaxial extensions 213 form the source/drain regions of the device.

Figure 9A:
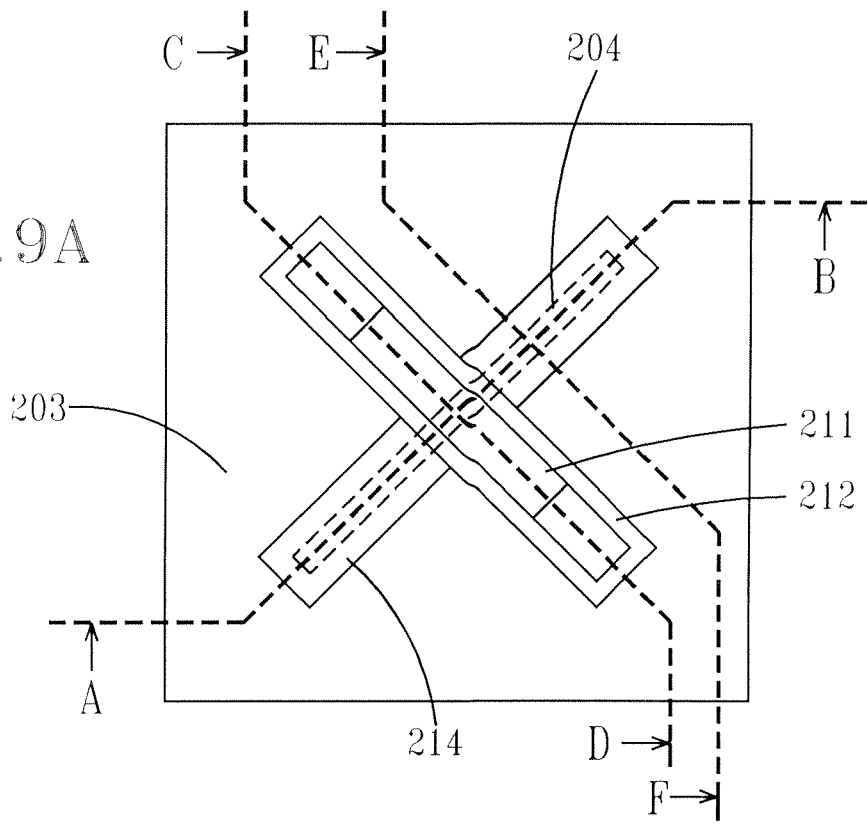
Figure 9B:
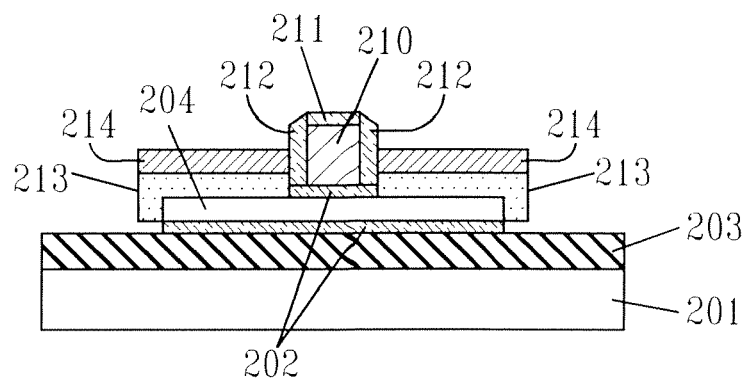
Figure 9C:
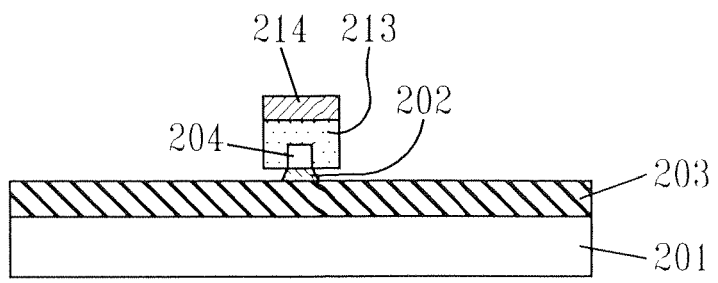

To complete the device fabrication, contacts are made to the device source region, the drain region and gate. As an example and in the case of a silicon nanowire channel, a self-aligned silicide 214 is fabricated as shown by FIGS. 9A-9C, and was explained earlier with reference to FIGS. 4A-4C. It is note that FIG. 9A represents a top-down view, 9B represents a cross sectional view through line A-B shown in FIGS. 9A, and 9C represents a cross sectional view through line E-F shown in FIG. 9A. Following silicidation, metal contacts are made to the silicide regions (not shown).

It is emphasized that the term 'nanowire channel' refers to either semiconductor nanowires 104 or 204 described above.

The following example is provided to illustrate some aspect of the present invention and to show some advantages of the instant invention.

EXAMPLE

Using the method discussed in FIGS. 1-4, a silicon nanowire FET with doped silicon source and drain regions was fabricated.

The nanowires synthesis included the following process steps: A 2 nm thick gold (Au) film was evaporated on a clean silicon (111) substrate. The substrate was then introduced into an UHV-CVD chamber and annealed at 500° C. for 10 minutes. The annealing at 500° C. caused the thin gold film to agglomerate into small gold droplets. These gold droplets were used as the catalyst for the nanowire growth. The substrate temperature was lowered to 420° C., which was the growth temperature. The growth initiated when silane (SiH$_4$) was introduced into the chamber. The silane pressure during growth was held at 2 torr. The growth time was set to grow nanowires that were about 10 microns long. The average nanowire diameter was about 25 nm.

The gold catalyst was selectively etched in a potassium iodide and iodine (KI/I$_2$) solution. A portion of the substrate (with the nanowires) was placed in a vial with ethanol. The vial was placed in an ultrasonic bath for 2 minutes to release the nanowires from the substrate and to form a suspension. The suspension was then filtered to remove debris.

A heavily doped silicon wafer was used as the host substrate for the silicon nanowires. A 2 nm thick thermal oxide was first grown on the substrate, and a 15 nm thick low pressure CVD silicon nitride was deposited over the thermal oxide. The nanowires suspension was then spin-coated over the host wafer. A 20 nm thick plasma enhanced (PECVD) SiO$_2$ film followed by a 50 nm thick PECVD Si$_3$N$_4$ film was deposited over the nanowires. Contact holes to the nanowires were made by lithography and RIE.

An RCA clean followed by a 100:1 DHF dip was performed prior to loading the host wafer into an UHV-CVD growth chamber for source/drain epitaxy. The growth temperature was 540° C. Silane and diborane (B$_2$H$_6$) were used to grow in-situ doped silicon with a boron concentration of about 1 E21 cm$^{-3}$. The silicon growth was non-selective.

Chemical mechanical polishing was used to remove the excess silicon from over the PECVD Si$_3$N$_4$ film. The wafers were polished using silica slurry at 47° C. on an IC1000P/Suba IV pad stack. The down force was 3 PSI.

Nickel silicide contacts were formed by depositing a blanket 9 nm thick Ni film over the wafer. A 60 second 100:1 DHF dip was applied before the nickel deposition. The wafer was RTA annealed at 420° C. for 5 seconds to form NiSi. The unreacted nickel was etched selectively using an aqua regia etch (H$_2$O:HCl:HNO$_3$ 4:5:1 40° C. for 30 min).

Figure 10A:
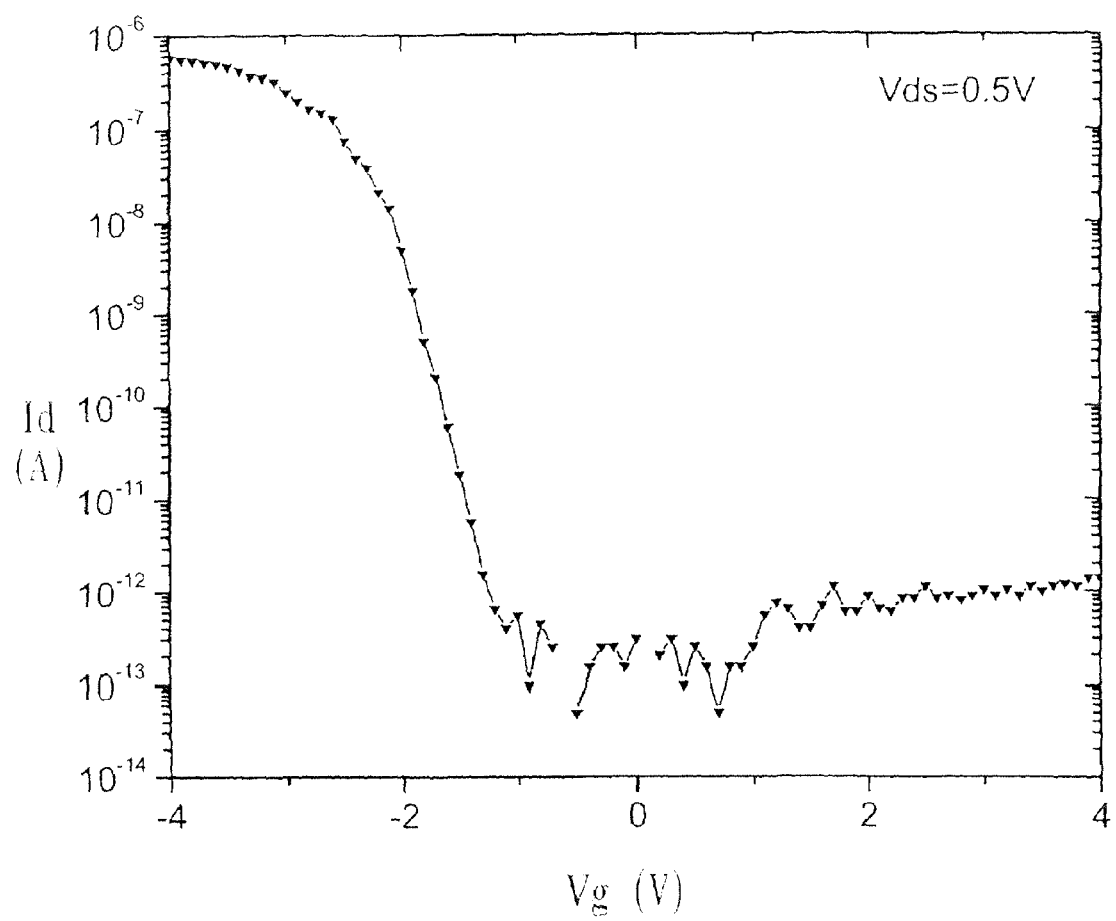
FIGS. 10A-B show measured Id-Vg and Id-Vds characteristic of a silicon p-FET fabricated using the method discussed in FIGS. 1-4.
Figure 10B:
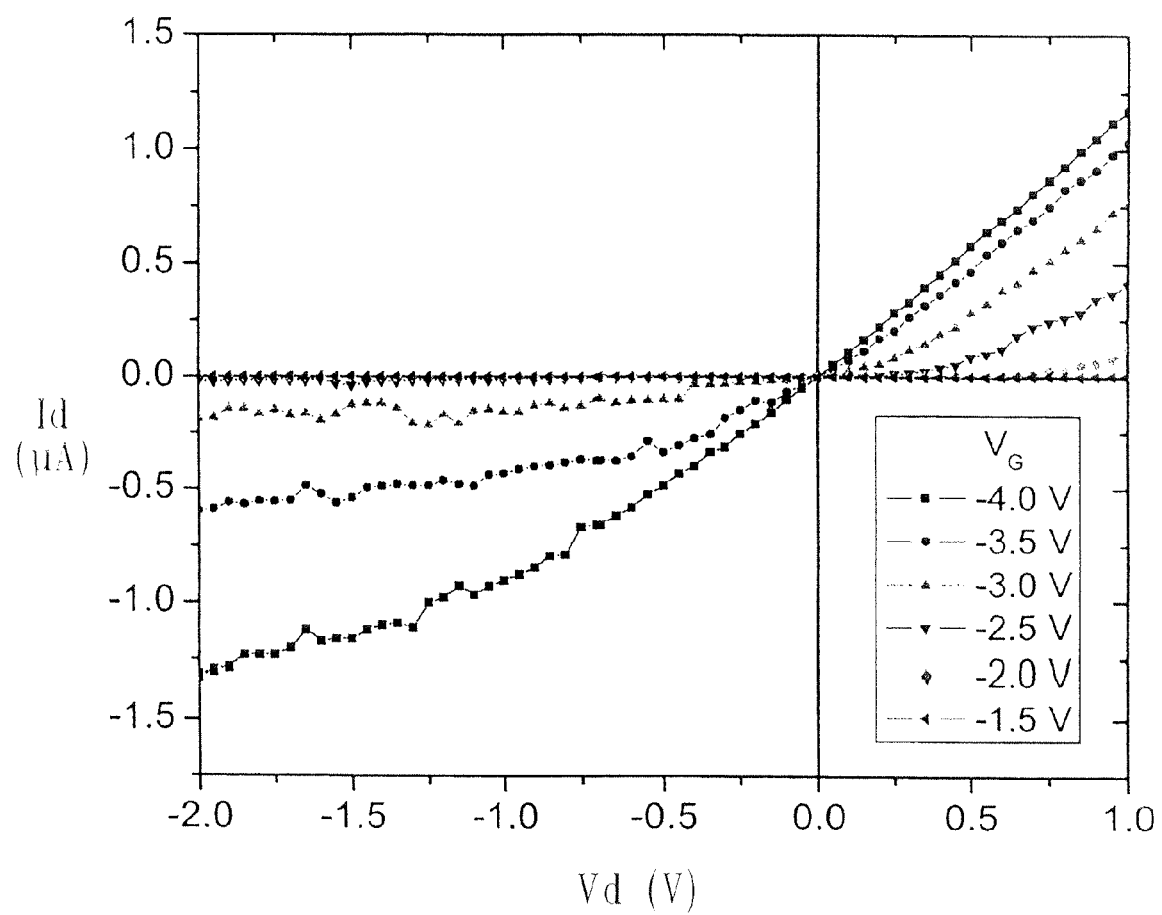
Figure 11:
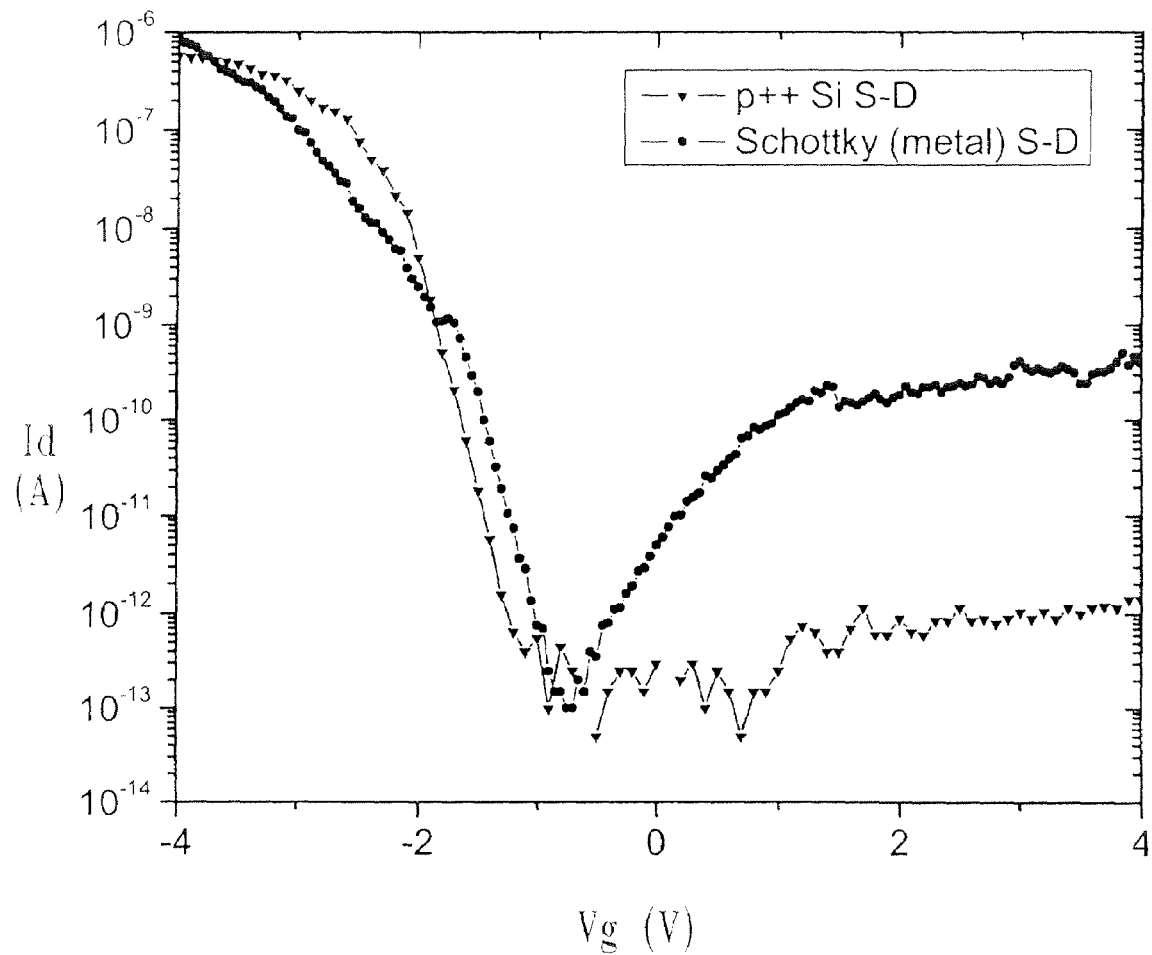
FIG. 11 shows measured Id-Vg characteristics of the silicon p-FET of FIG. 10, overlaid with the Id-Vg characteristics of a nanowire FET with Schottky contacts.

FIGS. 10A-10B show measured Id-Vg and Id-Vds characteristics of a nanowire p-FET fabricated as outlined above, and FIG. 11 shows measured Id-Vg characteristics of the silicon p-FET of FIG. 10, overlaid with the Id-Vg characteristics of a nanowire FET with Schottky (nickel) contacts. Note that the Schottky contact FET exhibit ambipolar behavior since the Ni contacts can provide both holes and electrons. The electron branch (for positive Vg) of the Id-Vg trace measured for the doped silicon source and drain device is completely suppressed. This clearly shows the advantage the doped silicon source and drain device has over the Schottky contact source and drain device.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. A field effect transistor (FET) comprising:
   a back gate comprising a doped semiconductor substrate;
   a back gate dielectric located on an upper surface of said back gate;
   a single-crystal semiconductor nanowire composed of an undoped semiconductor material located atop said back gate dielectric, said single-crystal semiconductor nanowire comprising a semiconductor channel, a first undoped semiconductor material portion located on one side of said semiconductor channel, and a second undoped semiconductor material portion located on another side of said semiconductor channel;
   a dielectric stack having a first contact opening extending to said first undoped semiconductor material portion and a second contact opening extending to said second undoped semiconductor material portion;
   a source region located in said first contact opening and in contact with said first undoped semiconductor material portion; and
   a drain region located in said second contact opening and in contact with said second undoped semiconductor material portion, wherein said source and drain regions each comprise a doped epitaxial semiconductor material extending upward from said first and second undoped semiconductor material portions in a radial orientation.

2. The field effect transistor of claim 1 wherein said source region and said drain region include at least one semiconductor material different than that of said semiconductor channel.

3. The field effect transistor of claim 1 wherein said source region and said drain region have a same crystal orientation as said first and second undoped semiconductor material portions.

4. The field effect transistor of claim 1 further comprising a metal-semiconductor alloy located over said source region and said drain region.

5. The field effect transistor of claim 4 wherein said semiconductor channel is a silicon nanowire and wherein metal-semiconductor alloy is a nickel-silicide.

6. The field effect transistor of claim 4 wherein said semiconductor channel is a geimanium nanowire and wherein metal-semiconductor alloy is a nickel-germanide.

7. The field effect transistor of claim 4 wherein said metal-semiconductor alloy is located in each of said first and second contact openings, and wherein said metal-semiconductor alloy has an upper surface that is planar with an upper surface of the dielectric stack.

8. The field effect transistor of claim 1 further comprising a hydrofluoric acid resistant etch stop layer located between said back gate dielectric and said single-crystal semiconductor nanowire.

9. A field effect transistor (FET) comprising:
a handle substrate;
an insulator film located on an upper surface of the handle substrate;
a lower gate dielectric portion located on an upper surface of said insulator film;
a single-crystal semiconductor nanowire composed of an undoped semiconductor material located on an upper surface of said lower gate dielectric portion, said single-crystal semiconductor nanowire comprising a semiconductor channel, a first undoped semiconductor material portion located on one side of said semiconductor channel, and a second undoped semiconductor material portion located on another side of said semiconductor channel, wherein said semiconductor channel, said first undoped semiconductor material portion and said second undoped semiconductor material portion each have an upper surface that is coplanar with each other;
an upper gate dielectric portion located on the upper surface of said semiconductor channel, but not atop said first and second undoped semiconductor material portions, wherein said upper gate dielectric portion has a length that is less than a length of said lower gate dielectric portion that is located beneath the single-crystal semiconductor nanowire;
a gate located atop the upper gate dielectric portion;
a source region in contact with the upper surface and a sidewall surface of said first undoped semiconductor material portion; and
a drain region in contact with the upper surface and a sidewall surface of said second undoped semiconductor material portion, wherein said source region and said drain region are located adjacent to said gate, and wherein said source and drain regions each comprise a doped epitaxial semiconductor material extending from said first and second undoped semiconductor material portions in a radial orientation.

10. The field effect transistor of claim 9 further comprising a spacer located adjacent said gate, wherein a base of said spacer is located on an upper surface of said upper gate dielectric portion.

11. The field effect transistor of claim 9 wherein said source region and said drain region include at least one semiconductor material different than that of said semiconductor channel.

12. The field effect transistor of claim 9 wherein said source region and said drain region have a same crystal orientation as said first and second undoped semiconductor material portions.

13. The field effect transistor of claim 9 further comprising a metal-semiconductor alloy located over said source region and said drain region.

14. The field effect transistor of claim 13 wherein said semiconductor channel is a silicon nanowire and wherein metal-semiconductor alloy is a nickel-silicide.

15. The field effect transistor of claim 14 wherein said semiconductor channel is a germanium nanowire and wherein metal-semiconductor alloy is a nickel-germanide.

* * * * *